(12) United States Patent
Parris et al.

(10) Patent No.: US 6,625,066 B1
(45) Date of Patent: Sep. 23, 2003

(54) DATA PATH DECODING TECHNIQUE FOR AN EMBEDDED MEMORY ARRAY

(75) Inventors: Michael C. Parris, Colorado Springs, CO (US); Kim C. Hardee, Colorado Springs, CO (US)

(73) Assignees: United Memories, Inc., Colorado Springs, CO (US); Sony Corporation, Tokyo (JP)

(\*) Notice: Subject to any disclaimer, the term of this patent is extended or adjusted under 35 U.S.C. 154(b) by 0 days.

(21) Appl. No.: 10/100,151

(22) Filed: Mar. 18, 2002

(51) Int. Cl.[7] .................................................. G11C 7/00
(52) U.S. Cl. ............... 365/189.02; 365/63; 365/189.05; 365/230.06
(58) Field of Search ........................ 365/230.02, 230.03, 365/230.06, 189.02, 189.05, 63

(56) References Cited

U.S. PATENT DOCUMENTS 5,781,493 A * 7/1998 Kobayashi ............. 365/230.03
6,125,070 A * 9/2000 Tomishima ............. 365/230.03

\* cited by examiner

*Primary Examiner*—Son Mai
(74) *Attorney, Agent, or Firm*—William J. Kubida; Peter J. Meza; Hogan & Hartson LLP

(57) ABSTRACT

A data path decoding technique and architecture for integrated circuit memory devices and those devices incorporating embedded dynamic random access memory ("DRAM") arrays provides an effective second level of decoding resulting in a need for routing fewer column select lines to the sense amplifiers as compared with existing designs while concomitantly providing for shortened local data lines resulting in less undesired resistance and capacitance. The technique and architecture of the present invention requires no additional on-chip area to that required by existing designs and adds no new gate delays or pass gates to the critical read data or write data paths. This is effectuated by the incorporation of an address function with the read/write enable ("RWEN") or separate read enable ("REN") and write enable ("WEN") signals. Consequently, half as many column select lines need be routed to the sense amplifiers since a second level of column decoding is provided.

13 Claims, 6 Drawing Sheets

DATA PATH DECODING TECHNIQUE FOR AN EMBEDDED MEMORY ARRAY

BACKGROUND OF THE INVENTION

The present invention relates, in general, to the field of integrated circuit ("IC") memory devices and those ICs incorporating embedded dynamic random access memory ("DRAM"). More particularly, the present invention relates to a data path decoding technique of especial applicability to DRAM devices and those ICs incorporating an embedded memory array.

In typical embedded DRAM architectures, local and global data read/write lines are often employed. In operation, the local read/write lines need to be selectively connected and disconnected to the global read/write lines as various sub-arrays are selected and de-selected to preclude data bus contention. In most designs, the local data lines tend to become relatively long with concomitantly large resistance and capacitance then resulting. Moreover, if the page length becomes long, a great deal of on-chip area is consumed with the routing of column address lines. For example, with sixteen bit column designs, column lines Y0 through Y15 must generally be routed through the sense amplifier region itself.

SUMMARY OF THE INVENTION

The data path decoding technique and architecture of the present invention advantageously obviates the shortcomings of these prior designs by providing what is, in essence, a second level of decoding. This uniquely results in a need for fewer column select lines and even shorter local data lines. Further, the technique and architecture of the present invention requires no additional on-chip area to that of prior techniques and adds no new gate delays or pass gates to the critical read data or write data paths. This is accomplished by effectively incorporating an address function in with the read/write enable ("RWEN") or separate read enable ("REN") and write enable ("WEN") signals. Consequently, half as many column select lines need be routed to the sense amplifiers since a second level of column decoding is thereby provided.

Particularly disclosed herein is an integrated circuit device including a memory array having a data path which comprises N column lines and first and second groups of N sense amplifiers respectively couplable to first and second pairs of complementary local data lines in response to signals on the N column lines. First and second local read/write circuits are respectively coupled to the first and second pairs of complementary local data lines and complementary global data lines are selectively couplable to either of the first and second pairs of complementary local data lines in response to first and second enable signals applied to the first and second local read/write circuits.

Further disclosed herein is an integrated circuit device including a memory array having a data path which comprises N read column lines and N write column lines. First and second groups of N sense amplifiers are respectively couplable to first and second pairs of complementary local data read lines in response to signals on the N read column lines and to first and second pairs of complementary local data write lines in response to signals on the N write column lines. First and second local read circuits are respectively coupled to the first and second pairs of complementary local data read lines and first and second local write circuits are also respectively coupled to the first and second pairs of complementary local data write lines. Complementary global data read lines are selectively couplable to either of the first and second pairs of complementary local data read lines in response to first and second read enable signals applied to the first and second local read circuits and complementary global data write lines are selectively couplable to either of the first and second pairs of complementary local data write lines in response to first and second write enable signals applied to the first and second local write circuits.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DESCRIPTION OF A REPRESENTATIVE EMBODIMENT

Figure 1:
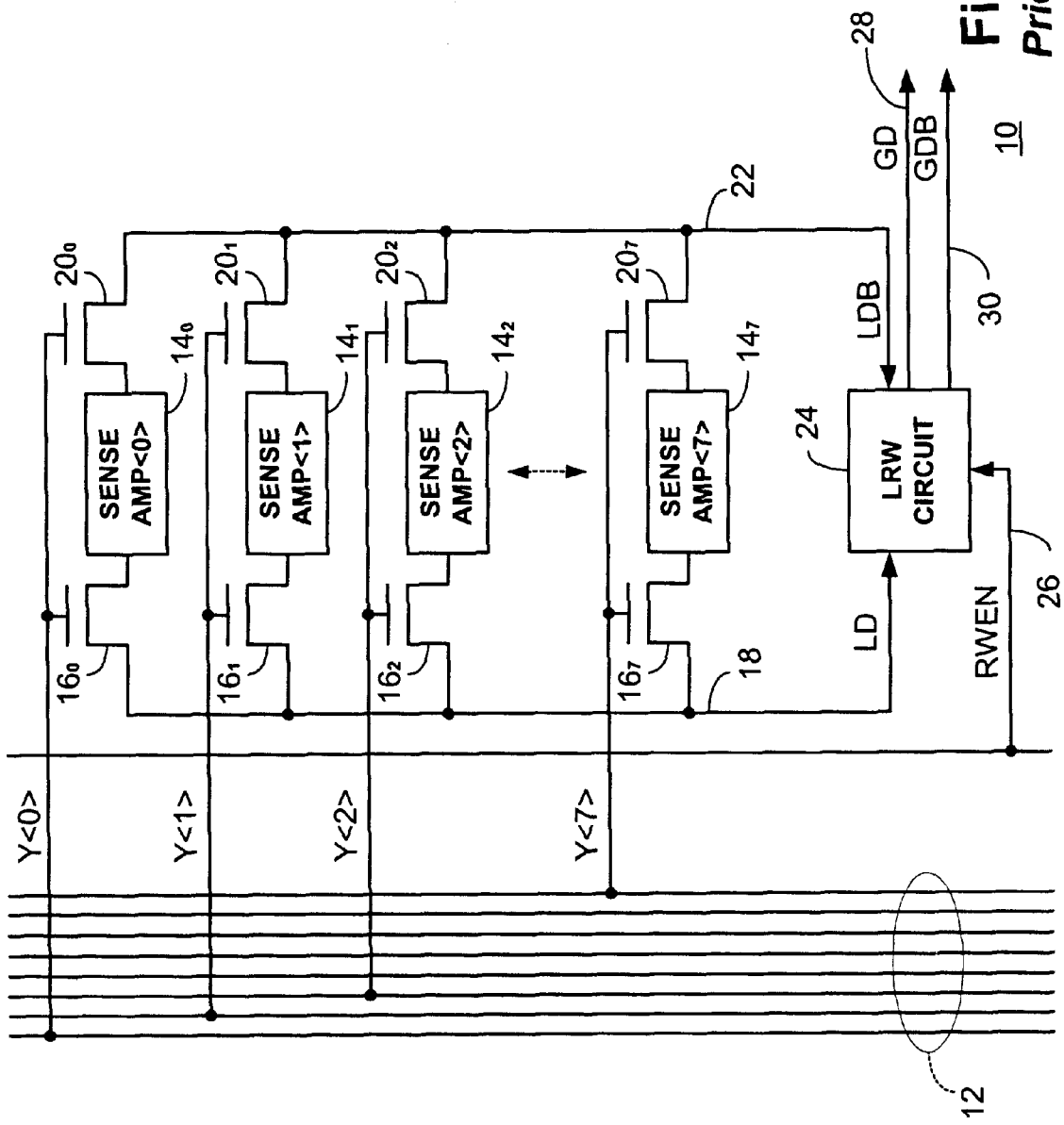
FIG. 1 is a simplified functional block diagram of a prior art memory data path decoding architecture for an embedded memory array illustrating eight predecoded read/write column lines, eight sense amplifiers and a single local read/write {"LRW") circuit responsive to a single read/write enable ("RWEN") signal and coupled to a pair of complementary global data lines ("GD" and "GDB")
Figure 2:
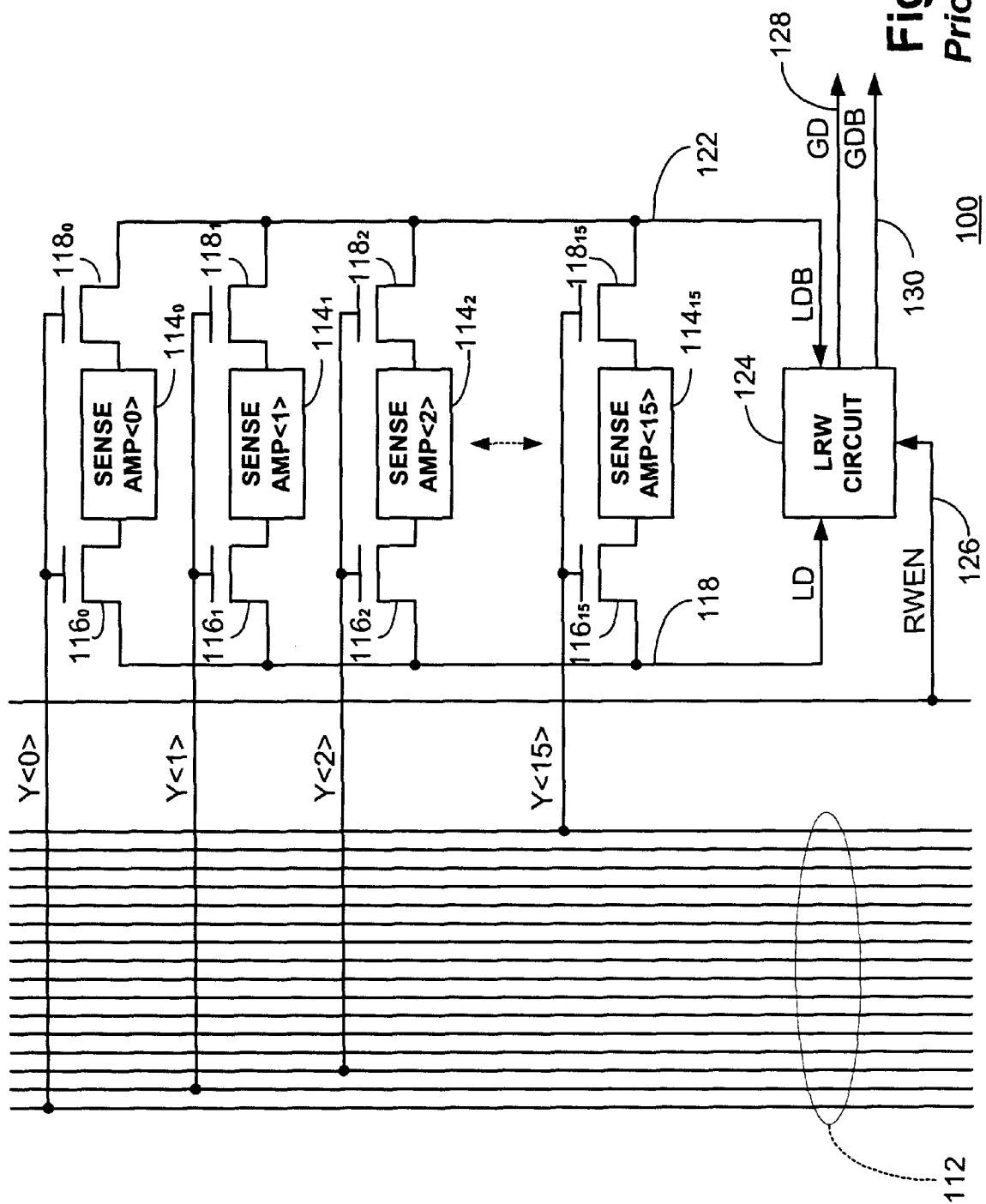
FIG. 2 is an additional simplified functional block diagram of a prior art memory array data path decoding architecture for an embedded memory array illustrating sixteen pre-decoded read/write column lines, sixteen sense amplifiers and a single LRW circuit responsive to a single RWEN signal and coupled to a pair of complementary global data lines.
Figure 3:
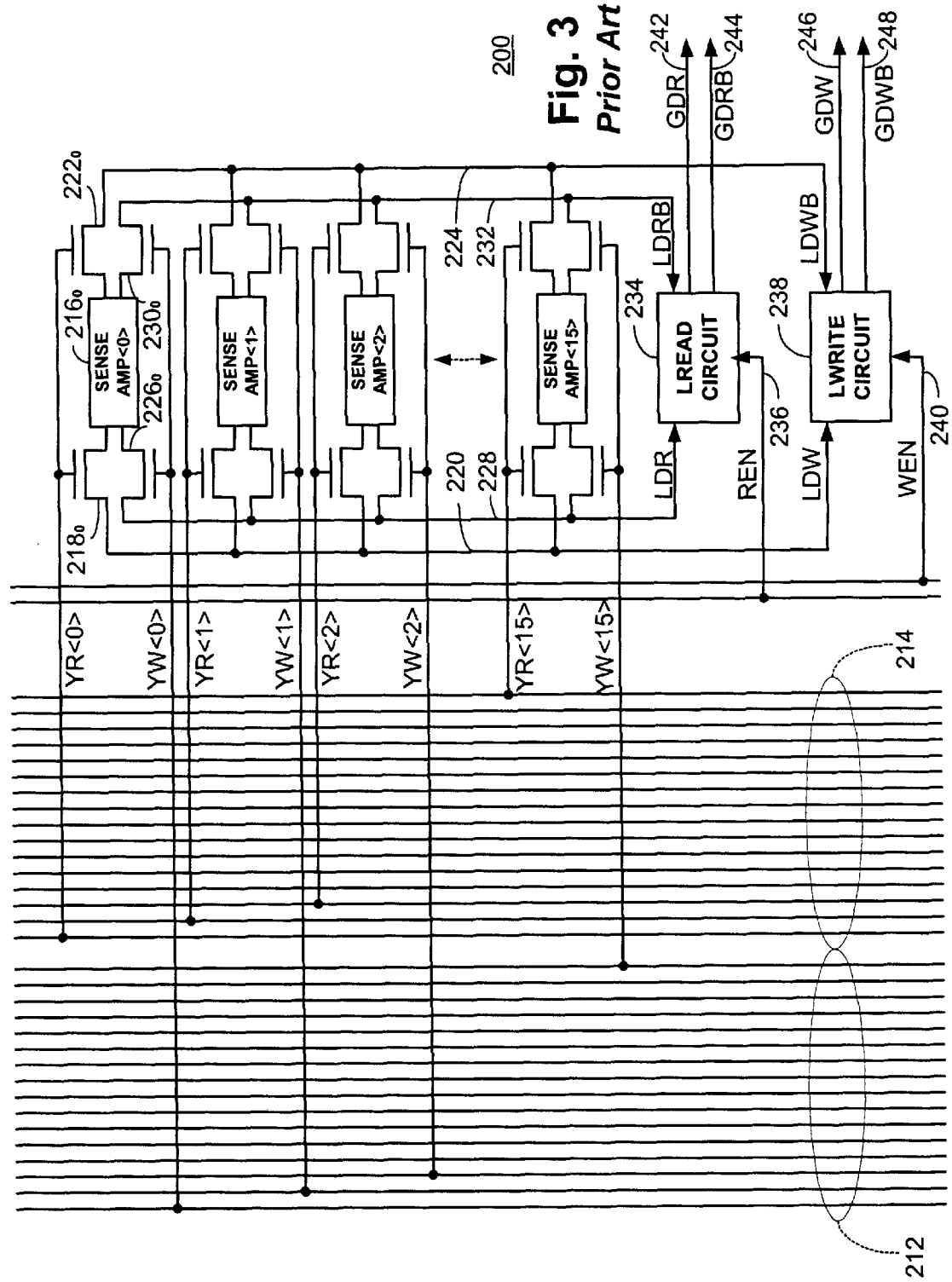
FIG. 3 is a further simplified functional block diagram of a prior art memory array data path decoding architecture for an embedded memory array illustrating sixteen pre-decoded "read" column ("YR") and sixteen pre-decoded "write" column ("YW") lines, sixteen sense amplifiers and separate local read ("LREAD") and local write ("LWRITE") circuits respectively responsive to separate read enable ("REN") and write enable ("WEN") signals and coupled to complementary global data read ("GDR" and "GDRB") and global data write ("GDW" and "GDWB") lines.

With reference now to FIG. 1, a simplified functional block diagram of a prior art memory data path 10 decoding architecture is shown. The data path $10$ may form a portion of an embedded memory array and illustrates eight pre-decoded read/write column lines $12$ together with eight sense amplifiers $14_0$ through $14_7$. The sense amplifiers $14_0$ through $14_7$ are coupled to complementary local data lines $18, 22$ ("LD" and "LDB") through corresponding N-channel transistor pass transistors $16_0$ through $16_7$ and $20_0$ through $20_7$. A single local read/write {"LRW") circuit $24$ is responsive to a single read/write enable ("RWEN") signal on line $26$ and is coupled to a pair of complementary global data lines $28, 30$ ("GD" and With reference additionally now to FIG. $2$, an additional simplified functional block diagram of a prior art memory array data path $100$ decoding architecture for an embedded memory array is shown. The data path $100$, as illustrated, includes sixteen pre-decoded read/write column lines $112$ and sixteen corresponding sense amplifiers $114_0$ through $114_7$. The sense amplifiers $114_0$ through $114_7$ are coupled to complementary LD and LDB lines $118, 122$ through corresponding N-channel pass transistors $116_0$ through $116_7$ and $120_0$ through $120_7$. A single local LRW circuit $124$ is responsive to a single RWEN signal on line $126$ and is coupled to GD line $128$ and GDB line $130$.

As can be seen with respect to the architectures illustrated in the preceding figures, there is a direct correspondence between the number of column select lines and the number of sense amplifiers required to implement these designs and a single LRW circuit is utilized in conjunction with all of the sense amplifiers. This LRW circuit is responsive to a single RWEN signal. Consequently, the number of column select lines which must be routed is relatively high while the length of the local data lines becomes relatively long.

With reference additionally now to FIG. $3$, a further simplified functional block diagram of a prior art memory array data path $200$ decoding architecture for an embedded memory array is shown. The data path $200$ illustrates includes sixteen pre-decoded "write" column ("YW") lines $212$ and sixteen pre-decoded "read" column ("YR") lines $214$ associated with sixteen sense amplifiers $216_0$ through $216_{15}$. The sense amplifiers $216_0$ through $216_{15}$ are coupled to complementary local data read lines ("LDR" and "LDRB") $228$ and $232$ through corresponding N-channel pass transistors $226_0$ through $226_{15}$ and $230_0$ through $230_{15}$ respectively. In like manner, the sense amplifiers $216_0$ through $216_{15}$ are also coupled to complementary local data write lines ("LDW" and "LDWB") $220$ and $224$ through corresponding N-channel pass transistors $218_0$ through $218_{15}$ and $222_0$ through $222_{15}$ respectively.

The LDR and LDRB lines $228, 232$ are coupled to a single local read ("LREAD") circuit $234$ responsive to a read enable ("REN") signal on line $236$. The output of the LREAD circuit $234$ is coupled to a pair of complementary global data read lines ("GDR" and "GDRB") $242$ and $244$ respectively. In like manner, the LDW and LDWB lines $220, 224$ are coupled to a single local write ("LWRITE") circuit $238$ responsive to a write enable ("WEN") signal on line $240$. The output of the LWRITE circuit $238$ is coupled to a pair of complementary global data write lines ("GDW" and "GDWB") $246$ and $248$ respectively.

As can be seen with respect to this particular design, sixteen YW lines $212$ and YR lines $214$ must be routed to the sense amplifiers $216_0$ through $216_{15}$. A single LREAD circuit $234$ and LWRITE circuit $238$ is associated with all of the sense amplifiers $216_0$ through $216_{15}$. Consequently, an even greater number of column select lines must be routed to the sense amplifiers while, again, the length of the local data read and local data write lines becomes relatively long.

With reference additionally now to FIG. $4$, a simplified functional block diagram of a representative embodiment of a memory array data path $300$ is shown employing a decoding technique in accordance with the present invention. As shown, the data path $300$ includes eight pre-decoded column read/write lines $302$ (Y<0> through Y<7>) and sixteen sense amplifiers $304_0$ through $304_{15}$ divided into two separate groups of eight, e.g. sense amplifiers $304_0$ through $304_7$ and sense amplifiers $304_8$ through $304_{15}$. Each of the groups of eight sense amplifiers has an associated LRW circuit such that sense amplifiers $304_0$ through $304_7$ are associated with LRW circuit $314$<0> while sense amplifiers $304_8$ through $304_{15}$ are associated with LRW circuit $314$<1>.

N-channel pass transistors $306_0$ through $306_7$ couple the sense amplifiers $304_0$ through $304_7$ to the LRW circuit $314$<0> through LD<0> line $308$<0> while N-channel pass transistors $310_0$ through $310_7$ also couple the sense amplifiers $304_0$ through $304_7$ to the LRW circuit $314$<0> through LDB<0> line $312$<0>. The LRW circuit $314$<0> is coupled to the global data lines, GD line $318$ and GDB line $320$ and receives a read/write enable signal on RWEN<0> line $312$<0>.

In like manner, N-channel pass transistors $306_8$ through $306_{15}$ couple the sense amplifiers $304_8$ through $304_{15}$ to the LRW circuit $314$<1> through LD<1> line $308$<1> while N-channel pass transistors $310_8$ through $310_{15}$ also couple the sense amplifiers $304_8$ through $304_{15}$ to the LRW circuit $314$<1> through LDB<1> line $312$<1>. The LRW circuit $314$<1> is also coupled to the GD line $318$ and GDB line $320$ and receives a separate read/write enable signal on RWEN<1> line $312$<1>.

As can be determined, only eight pre-decoded column read/write lines $302$ (Y<0> through Y<7>) need be routed to the sixteen sense amplifiers $304_0$ through $304_{15}$. Moreover, since these are effectively divided into two separate groups of eight, e.g. sense amplifiers $304_0$ through $304_7$ and sense amplifiers $304_8$ through $304_{15}$, each having an associated LRW circuit $314$<0> and $314$<1>, the lengths of the local data lines $308$<0>/$308$<1> and $312$<0>/$312$<1> are also decreased compared to that of previous designs. The separate RWEN<0> and RWEN<1> signals effectively provide a second level of decoding by selectively enabling either of the two LRW circuits $314$<0> and $314$<1> and coupling the corresponding pair of local data lines to the global data lines $318$ and $320$.

With reference additionally now to FIG. $5$, another simplified functional block diagram of a further representative embodiment of a memory array data path $400$ utilizing a decoding technique in accordance with the present invention is shown. The data path $400$ illustrated incorporates eight separate pre-decoded YW lines $402$ (YW<0> through YW<7>) and YR lines $404$ (YR<0> through YR<7>) coupled to sixteen sense amplifiers $406_0$ through $406_{15}$ divided into two separate groups of eight, e.g. sense amplifiers $406_0$ through $406_7$ and sense amplifiers $406_8$ through $406_{15}$. Each of the two groups of sense amplifiers $406_0$ through $406_{15}$ has a separate, associated LREAD circuit and LWRITE circuit such that sense amplifiers $406_0$ through $406_7$ are associated with LREAD circuit $424$<0> and LWRITE circuit $426$<0> while sense amplifiers $406_8$ through $406_{15}$ are associated with LREAD circuit $424$<1> and LWRITE circuit $426$<1>.

N-channel pass transistors $408_0$ through $408_7$ couple the sense amplifiers $406_0$ through $406_7$ to the LWRITE circuit $426$<0> through LDW<0> line $410$<0> while N-channel pass transistors $412_0$ through $412_7$ couple the sense amplifiers $406_0$ through $406_7$ to the LWRITE circuit 426<0> through LDWB<0> line 414<0>. Correspondingly, N-channel pass transistors $416_0$ through $416_7$ couple the sense amplifiers $406_0$ through $406_7$ to the LREAD circuit 424<0> through LDR<0> line 418<0> while N-channel pass transistors $420_0$ through $420_7$ couple the sense amplifiers $406_0$ through $406_7$ to the LREAD circuit 424<0> through LDRB<0> line 422<0>.

In like manner, N-channel pass transistors $408_8$ through $408_{15}$ couple the sense amplifiers $406_8$ through $406_{15}$ to the LWRITE circuit 426<1> through LDW<1> line 410<1> while N-channel pass transistors $412_8$ through $412_{15}$ couple the sense amplifiers $406_8$ through $406_{15}$ to the LWRITE circuit 426<1> through LDWB<1> line 414<1>. Finally, N-channel pass transistors $416_8$ through $416_{15}$ couple the sense amplifiers $406_8$ through $406_{15}$ to the LREAD circuit 424<1> through LDR<1> line 418<1> while N-channel pass transistors $420_8$ through $420_{15}$ couple the sense amplifiers $406_8$ through $406_{15}$ to the LREAD circuit 424<1> through LDRB<1> line 422<1>.

The LREAD circuits 424<0> and 424<1> are coupled to complementary pairs of global data read lines, GDR line 432 and GDRB line 434 while the LWRITE circuits 426<0> and 426<1> are coupled to complementary pairs of global data write lines, GDW line 436 and GDWB line 438. The LREAD circuit 424<0> is responsive to a read enable signal REN<0> on line 430<0> while the corresponding LREAD circuit 424<1> is responsive to the REN<1> on line 430<1>. In similar fashion, the LWRITE circuit 426<0> is responsive to a write enable signal WEN<0> on line 428<0> while the corresponding LWRITE circuit 426<1> is responsive to the WEN<1> on line 428<1>.

As can be determined, with this design only eight separate pre-decoded YW lines 402 (YW<0> through YW<7>) and eight YR lines 404 (YR<0> through YR<7>) need be routed to sixteen sense amplifiers $406_0$ through $406_{15}$. The sense amplifiers $406_0$ through $406_{15}$ have been divided into two separate groups of eight, e.g. sense amplifiers $406_0$ through $406_7$ and sense amplifiers $406_8$ through $406_{15}$ thereby serving to decrease the length of the complementary pairs of local data read and local data write lines. The separate read enable signals routed to corresponding ones of the two LREAD circuits 424<0>/424<1> and write enable signals routed to each of the two LWRITE circuits 426<0>/426<1> provides an effective second level of decoding. In operation, this accomplished by selectively enabling either of the two LREAD circuits 424<0> and 424<1> and coupling the corresponding pair of local data read lines to the global data read lines 432, 434 and selectively enabling either of the two LWRITE circuits 426<0> and 426<1> and coupling the corresponding pair of local data write lines to the global data write lines 436, 438.

Figure 4:
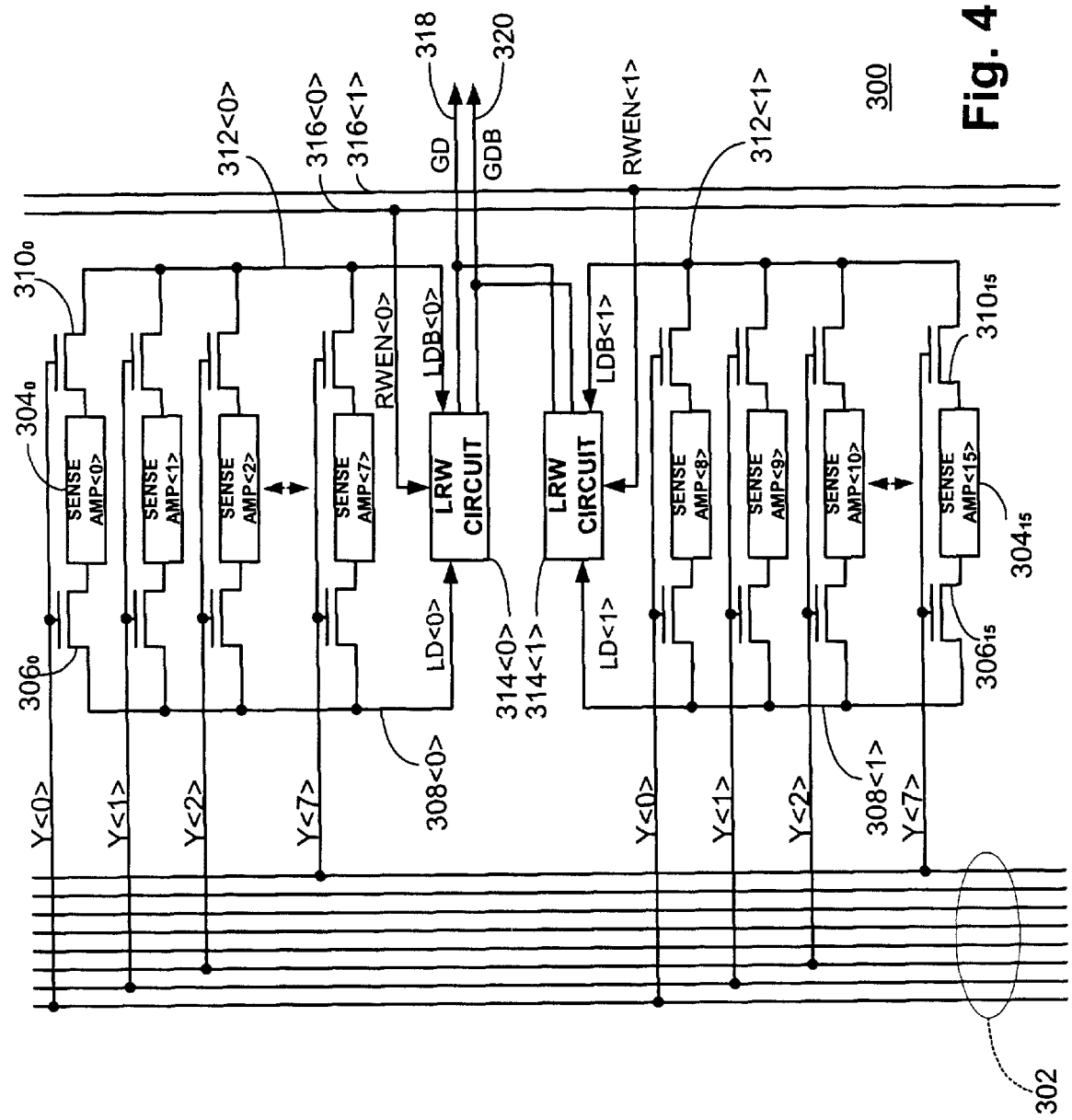
FIG. 4 is a simplified functional block diagram of a representative embodiment of a memory array data path utilizing a decoding technique in accordance with the present invention illustrating eight pre-decoded column read/write lines, sixteen sense amplifiers divided into two separate groups of eight with each group having an associated LRW circuit respectively responsive to separate read/write enable ("RWEN<0>" and "RWEN<1>") signals and coupled to complementary global data lines.
Figure 5:
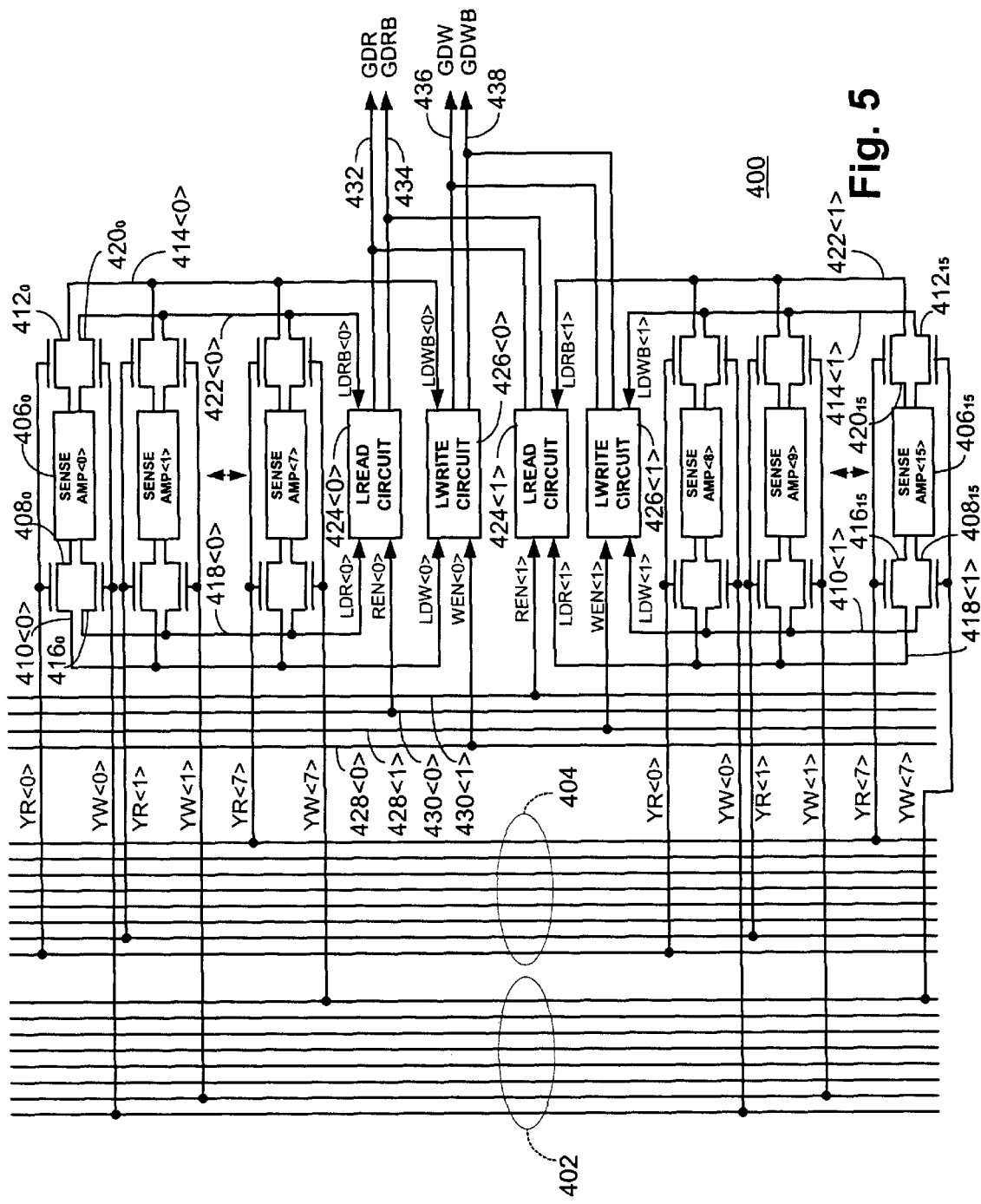
FIG. 5 is another simplified functional block diagram of a further representative embodiment of a memory array data path utilizing a decoding technique in accordance with the present invention illustrating eight separate pre-decoded YW and YR lines, sixteen sense amplifiers divided into two separate groups of eight with each group having a separate LREAD and LWRITE circuit respectively responsive to separate REN<0>/REN<1> and WEN<0>/WEN<1> signals and coupled to the complementary pairs of GDR/GDRB and GDW/GDWB global data lines.
Figure 6:
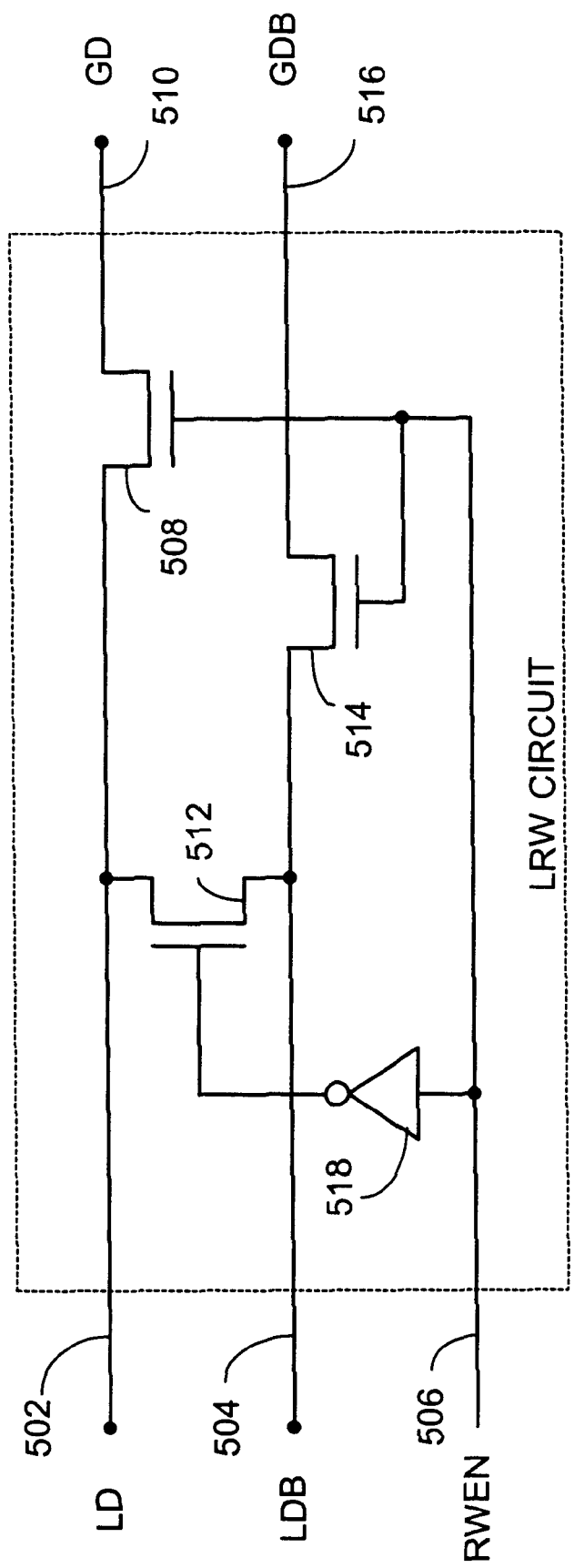
FIG. 6 is a detailed schematic illustration of an LRW circuit in accordance with a particular embodiment of the present invention.

With reference additionally now to FIG. 6, a detailed schematic illustration of an LRW circuit 500 in accordance with a particular embodiment of the present invention is shown. The LRW circuit 500 may be utilized, for example, in conjunction with the data path 300 of the preceding FIG. 4.

As illustrated, the LRW circuit 500 is coupled to the complementary local data lines such that the LD signal is coupled to line 502 while the LDB signal is coupled to line 504. A read/write enable signal is supplied as input on RWEN line 506. An N-channel transistor 508 selectively couples the LD line 502 directly to the global data ("GD") line 510 while another N-channel transistor 514 selectively couples the LDB line 504 to the complementary GDB line 516. The gate terminals of transistors 508 and 514 are coupled to the RWEN line 506 such that a logic level "high" signal turns them "on" coupling the local data lines LD line 502 and LDB line 504 to the global data lines GD line 510 and GDB line 516 respectively. With a logic level "low" signal on RWEN line 506, the local and global data lines are not connected.

An additional N-channel transistor 512 is coupled across the LD line 502 and 504 and has its gate terminal connected to the output of an inverter 518 which has its input coupled to the RWEN line 508. A logic level "low" signal on the RWEN line 508 then causes a corresponding logic level "high" at the gate terminal of the transistor 512 effectively shorting the LD line 502 and LDB line 504. When a logic level "high" signal is received on RWEN line 506, transistor 512 is "off". It should be noted that, in other implementations of an LRW circuit 500, the transistor 512 and inverter 518 may be replaced with a single P-channel device. In any event, in certain applications the transistor 512 may, or may not be required depending upon the operating speed of the particular implementation of the present invention.

While there have been described above the principles of the present invention in conjunction with specific memory array architectures, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. An integrated circuit device including a memory array having a data path comprising:

N column lines;

first and second groups of N sense amplifiers respectively couplable to first and second pairs of complementary local data lines in response to signals on said N column lines;

first and second local read/write circuits respectively coupled to said first and second pairs of complementary local data lines; and complementary global data lines selectively couplable to either of said first and second pairs of complementary local data lines in response to first and second enable signals applied to said first and second local read/write circuits, wherein said first and second local read/write circuits comprise first and second switching devices for selectively coupling said first and second pairs of complementary local data lines to said complementary global data lines in response to said first and second enable signals, and a third switching device for selectively shorting together said first or said second pairs of complementary local data lines when an opposite one of said first and second local read/write circuits couples a corresponding one of said first or second pairs of local data lines to said global data lines.

2. The integrated circuit device of claim 1 wherein N=8.

3. The integrated circuit device of claim 1 wherein said N column lines comprise pre-decoded read/write column lines.

4. The integrated circuit device of claim 1 further comprising:

first and second switching devices for selectively coupling designated ones of said sense amplifiers to said first and second pairs of complementary local data lines in response to said signals on said N column lines.

5. The integrated circuit device of claim 4 wherein said first and second switching devices comprise MOS transistors.

6. The integrated circuit device of claim 5 wherein said MOS transistors comprise N-channel devices.

7. The integrated circuit device of claim 1 wherein said first and second enable signals are complementary.

8. The integrated circuit device of claim 1 wherein said first and second switching devices comprise MOS transistors.

9. The integrated circuit device of claim 8 wherein said MOS transistors comprise N-channel transistors.

10. The integrated circuit device of claim 1 wherein each of said first and second local read/write circuits comprise:

said first and second pairs of complementary local data lines coupled to respective first and second inputs of said circuit;

a read/write enable line coupled to a third input of said circuit;

said first and second complementary global data lines coupled to respective outputs of said circuit;

first and second switching devices respectively coupling said first and second inputs to said first and second outputs, said first and second switching devices having a control terminal thereof coupled to said third input and being operative in response to said first enable signal; and a third switching device coupled between said first and second inputs, said third switching device having a control terminal thereof coupled to said third input and being operative in response to said second enable signal.

11. The integrated circuit device of claim 10 wherein said first, second and third switching devices comprise MOS transistors.

12. The integrated circuit device of claim 11 wherein said MOS transistors comprise N-channel devices.

13. The integrated circuit device of claim 11 further comprising:

an inverter coupling said third input to said control terminal of said third switching device.

* * * * *